(12) United States Patent
Ying et al.

(10) Patent No.: US 10,338,445 B2
(45) Date of Patent: Jul. 2, 2019

(54) PIXEL DRIVING STRUCTURE AND LIQUID CRYSTAL DISPLAY PANEL

(71) Applicant: Shenzhen China Star Optoelectronics Technology Co., Ltd., Shenzhen (CN)

(72) Inventors: Jianjian Ying, Shenzhen (CN); Peng Du, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 99 days.

(21) Appl. No.: 15/517,161

(22) PCT Filed: Mar. 15, 2017

(86) PCT No.: PCT/CN2017/076775
§ 371 (c)(1),
(2) Date: Apr. 5, 2017

(87) PCT Pub. No.: WO2018/141123
PCT Pub. Date: Aug. 9, 2018

(65) Prior Publication Data
US 2018/0267377 A1    Sep. 20, 2018

(30) Foreign Application Priority Data
Feb. 3, 2017 (CN) .......................... 2017 1 0063458

(51) Int. Cl.
| | |
|---|---|
| H01L 27/14 | (2006.01) |
| H01L 29/04 | (2006.01) |
| H01L 29/15 | (2006.01) |
| H01L 31/036 | (2006.01) |
| G02F 1/1362 | (2006.01) |

(Continued)

(52) U.S. Cl.
CPC ...... *G02F 1/136286* (2013.01); *G02F 1/1368* (2013.01); *G09G 3/3607* (2013.01); *G09G 3/3614* (2013.01); *G09G 3/3648* (2013.01); *H01L 27/124* (2013.01); *H01L 29/785* (2013.01); *H01L 29/78696* (2013.01); *G02F 2201/40* (2013.01); *G02F 2201/52* (2013.01); *G09G 2300/0452* (2013.01);
(Continued)

(58) Field of Classification Search
None
See application file for complete search history.

(56) References Cited

U.S. PATENT DOCUMENTS

| | | | |
|---|---|---|---|
| 2013/0100005 A1* | 4/2013 | Shih | G02F 1/136209 345/92 |
| 2015/0187293 A1* | 7/2015 | Yoo | G09G 3/3607 345/694 |
| 2015/0235614 A1* | 8/2015 | Kim | G09G 5/02 345/205 |

* cited by examiner

*Primary Examiner* — Calvin Y Choi
(74) *Attorney, Agent, or Firm* — Leong C. Lei

(57) ABSTRACT

Provided are a pixel driving structure, in which the nth column of TFTs (T) are arranged at positions where the nth column of sub pixels (P) is close to the nth data line (D(n)); in the nth column of sub pixels (P), four sub pixels (P) or two sub pixels (P), which are adjacent vertically in the upper and the lower are set to be a pixel group (PG), and the nth data line (D(n)) sets a signal period to define polarities of respective sub pixels (P) in the pixel group (PG) to make polarity inversion occur at a edge of the two adjacent pixel groups (PG) in the upper and the lower, and polarities of two adjacent columns of sub pixels (P) are opposite to achieve display effect similar to a dot inversion. The pixel aperture regions can be neatly aligned to prevent the color washout.

5 Claims, 8 Drawing Sheets

(51) Int. Cl.
*H01L 27/12* (2006.01)
*G02F 1/1368* (2006.01)
*H01L 29/78* (2006.01)
*H01L 29/786* (2006.01)
*G09G 3/36* (2006.01)

(52) U.S. Cl.
CPC ............... *G09G 2300/0465* (2013.01); *G09G 2320/0242* (2013.01); *G09G 2330/021* (2013.01)

PIXEL DRIVING STRUCTURE AND LIQUID CRYSTAL DISPLAY PANEL

FIELD OF THE INVENTION

The present invention relates to a display technology field, and more particularly to a pixel driving structure and a liquid crystal display panel.

BACKGROUND OF THE INVENTION

The LCD (Liquid Crystal Display) possesses many advantages of being ultra thin, power saved and radiation free. It has been widely utilized in, such as LCD TVs, mobile phones, Personal Digital Assistant (PDA), digital cameras, laptop screens or notebook screens, and dominates the flat panel display field.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF). The light of backlight module is refracted to generate images by applying driving voltages to the two substrates for controlling the rotations of the liquid crystal molecules.

The liquid crystal display panel comprises a plurality of Red (R), Green (G) and Blue (B) sub pixels arranged in array. Each sub pixel is electrically coupled to one thin film transistor (TFT), and a gate (Gate) of the TFT is coupled to a horizontal scan line, and a drain is coupled to a vertical data line, and a source is coupled to a corresponding sub pixel. The enough voltage is applied to the level scan line, and all the TFTs electrically coupled to the scan line are activated. Thus, the signal voltage on the data line can be written into the sub pixel to control the transmittances of the liquid crystals to realize the display effect.

The liquid crystal molecules have a certain property, which is that the liquid crystal molecules will be polarized if the voltage of the same direction is applied to the liquid crystal molecules with a long period of time. Even the voltage disappears, the property of the liquid crystal molecules will be destroyed and can no longer be rotated due to the variation of the electrical field. Therefore, the liquid crystal display panel must be driven alternately. As showing images, the liquid crystal molecules are rotated with a certain frequency to prevent that the liquid crystal molecules fixedly lean to the same direction and lose the activity. At present, the liquid crystal display panel supports kinds of inversion modes, such as dot inversion mode, row inversion mode and column inversion mode. The achievement of the inversion is mainly to alternately change the positive and negative polarities of the TFT source voltage (i.e. the positive and negative polarities of the signal voltage transmitted by the data line) to realize the objective of the alternating current driving.

Please refer to FIG. 1. In the traditional pixel driving structure utilizing the column inversion mode, the nth data lines D(n) (n is a positive integer larger than 1) are alternately connected with the TFTs T of the n−1th column of the sub pixels P and the nth column of the sub pixels P at its two sides: the TFT T in the sub pixel P of the mth row (m is a positive integer), the nth column is connected with the nth data line D(n) at the right of the nth data line D(n), and the TFT T in the sub pixel P of the m+1th row, the n+1th column is connected with the nth data line D(n) at the left of the nth data line D(n); the polarities of the signal voltages transmitted by the two adjacent data lines are opposite; such arrangement can achieve the display effect of dot inversion. However, one of the two adjacent TFTs T in the same column of sub pixels P is at left corresponding to the sub pixel P, and the other is at right corresponding to the sub pixel P, and the TFT regions generally requires the Black Matrix (BM) for light shielding. The alignments of the aperture regions except the TFTs are not neatly aligned, and the arrangements of the aperture regions of the two adjacent rows of sub pixels are different. The bright and dark lines and the irregular spots (Mura) may easily appear to reduce the display quality.

Please refer to FIG. 2 showing a pixel driving structure, commonly used at present in column inversion mode, which is improved over FIG. 1. All the data lines use the wiring detouring design to make the TFTs neatly aligned in one column, and the aperture region of the corresponding sub pixels are neatly aligned, too, which can overcome the display quality issue caused by the arrangement of the aperture regions which is not neat. Nevertheless, such design increases the entire length of the data lines (about 2.5 times the length of the original data lines), which tremendously increase the resistance loading of the data lines and meanwhile, the area of the data lines overlapping with other metal lines increases, therefore, the capacitance loading will increase, too. The wrong charging rate of the panel is high. Particularly, it is more sensitive for the high resolution panel, and the panel power consumption also will increase.

SUMMARY OF THE INVENTION

An objective of the present invention is to provide a pixel driving structure, in which the pixel aperture regions can be neatly aligned to eliminate the display defects, such as the bright and dark lines and the irregular spots to prevent the color washout, to reduce the power consumption and to promote the display quality.

Another objective of the present invention is to provide a liquid crystal display panel, in which the pixel aperture regions are neatly aligned, and no display defects, such as the bright and dark lines and the irregular spots exist to possess the color washout prevention ability, the lower power consumption and the better display quality.

For realizing the aforesaid objectives, the present invention provides a pixel driving structure, comprising:

a plurality of sub pixels arranged in array, and each column of sub pixels being sequentially and repeatedly aligned in an order of a red sub pixel, a green sub pixel and a blue sub pixel;

scan lines extending horizontally and corresponding to all rows of sub pixels; m being set to be a positive integer, and a mth scan line being correspondingly set above a mth row of sub pixels;

data lines extending vertically and corresponding to all columns of sub pixels; n being set to be a positive integer, and a nth data line being correspondingly set at left of a nth column of sub pixels;

and TFTs being set corresponding to all sub pixels; a nth column of TFTs being arranged at positions where the nth column of sub pixels is close to the nth data line; a gate of TFT of the mth row, the nth column being electrically coupled to the mth scan line, and a drain being electrically coupled to the nth data line, and a source being electrically coupled to a sub pixel of the mth row, the nth column;

in the nth column of sub pixels, four sub pixels or two sub pixels, which are adjacent vertically in the upper and the lower being a pixel group, and the nth data line setting a signal period to define polarities of respective sub pixels in the pixel group to make polarity inversion occur at a edge of the two adjacent pixel groups in the upper and the lower, and polarities of two adjacent columns of sub pixels being opposite to achieve display effect similar to a dot inversion.

Selectably, in the nth column of sub pixels, the four sub pixels, which are adjacent vertically in the upper and the lower being a pixel group; in the two adjacent pixel groups in the upper and the lower, in the signal period corresponded with the pixel group in the upper, the four sub pixels in the pixel group are collectively defined to have a positive polarity or a negative polarity; in the signal period corresponded with the pixel group in the lower, the four sub pixels in the pixel group are collectively defined to have a negative polarity or a positive polarity so that the polarities of the two adjacent pixel groups in the upper and the lower are opposite.

Selectably, in the nth column of sub pixels, the two sub pixels, which are adjacent vertically in the upper and the lower being a pixel group; in the two adjacent pixel groups in the upper and the lower, in the signal period corresponded with the pixel group in the upper, the two sub pixels in the pixel group are collectively defined to have a positive polarity or a negative polarity; in the signal period corresponded with the pixel group in the lower, the two sub pixels in the pixel group are collectively defined to have a negative polarity or a positive polarity so that the polarities of the two adjacent pixel groups in the upper and the lower are opposite.

Selectably, in the nth column of sub pixels, the four sub pixels, which are adjacent vertically in the upper and the lower being a pixel group; in the two adjacent pixel groups in the upper and the lower, in the signal period corresponded with the pixel group in the upper, the first three sub pixels in the pixel group are defined to have a positive polarity or a negative polarity, and the last one sub pixel in the pixel group is defined to have an opposite polarity of the polarity of the first three sub pixels; in the signal period corresponded with the pixel group in the lower, the first three sub pixels in the pixel group are defined to have a negative polarity or a positive polarity, and the last one sub pixel in the pixel group is defined to have an opposite polarity of the polarity of the first three sub pixels.

The TFT is a tri-gate TFT.

The present invention further provides a liquid crystal display panel, comprising a pixel driving structure, and the pixel driving structure comprising:

a plurality of sub pixels arranged in array, and each column of sub pixels being sequentially and repeatedly aligned in an order of a red sub pixel, a green sub pixel and a blue sub pixel;

scan lines extending horizontally and corresponding to all rows of sub pixels; m being set to be a positive integer, and a mth scan line being correspondingly set above a mth row of sub pixels;

data lines extending vertically and corresponding to all columns of sub pixels; n being set to be a positive integer, and a nth data line being correspondingly set at left of a nth column of sub pixels;

and TFTs being set corresponding to all sub pixels; a nth column of TFTs being arranged at positions where the nth column of sub pixels is close to the nth data line; a gate of TFT of the mth row, the nth column being electrically coupled to the mth scan line, and a drain being electrically coupled to the nth data line, and a source being electrically coupled to a sub pixel of the mth row, the nth column;

in the nth column of sub pixels, four sub pixels or two sub pixels, which are adjacent vertically in the upper and the lower being a pixel group, and the nth data line setting a signal period to define polarities of respective sub pixels in the pixel group to make polarity inversion occur at a edge of the two adjacent pixel groups in the upper and the lower, and polarities of two adjacent columns of sub pixels being opposite to achieve display effect similar to a dot inversion.

Selectably, in the nth column of sub pixels, the four sub pixels, which are adjacent vertically in the upper and the lower being a pixel group; in the two adjacent pixel groups in the upper and the lower, in the signal period corresponded with the pixel group in the upper, the nth data line collectively defines the four sub pixels in the pixel group to have a positive polarity or a negative polarity; in the signal period corresponded with the pixel group in the lower, the nth data line collectively defines the four sub pixels in the pixel group to have a negative polarity or a positive polarity so that the polarities of the two adjacent pixel groups in the upper and the lower are opposite.

Selectably, in the nth column of sub pixels, the two sub pixels, which are adjacent vertically in the upper and the lower being a pixel group; in the two adjacent pixel groups in the upper and the lower, in the signal period corresponded with the pixel group in the upper, the nth data line collectively defines the two sub pixels in the pixel group to have a positive polarity or a negative polarity; in the signal period corresponded with the pixel group in the lower, the nth data line collectively defines the two sub pixels in the pixel group to have a negative polarity or a positive polarity so that the polarities of the two adjacent pixel groups in the upper and the lower are opposite.

Selectably, in the nth column of sub pixels, the four sub pixels, which are adjacent vertically in the upper and the lower being a pixel group; in the two adjacent pixel groups in the upper and the lower, in the signal period corresponded with the pixel group in the upper, the nth data line defines the first three sub pixels in the pixel group to have a positive polarity or a negative polarity, and defines the last one sub pixel in the pixel group to have an opposite polarity of the polarity of the first three sub pixels; in the signal period corresponded with the pixel group in the lower, the nth data line defines the first three sub pixels in the pixel group to have a negative polarity or a positive polarity, and defines the last one sub pixel in the pixel group to have an opposite polarity of the polarity of the first three sub pixels.

The TFT is a tri-gate TFT.

The present invention further provides a pixel driving structure, comprising:

a plurality of sub pixels arranged in array, and each column of sub pixels being sequentially and repeatedly aligned in an order of a red sub pixel, a green sub pixel and a blue sub pixel;

scan lines extending horizontally and corresponding to all rows of sub pixels; m being set to be a positive integer, and a mth scan line being correspondingly set above a mth row of sub pixels;

data lines extending vertically and corresponding to all columns of sub pixels; n being set to be a positive integer, and a nth data line being correspondingly set at left of a nth column of sub pixels;

and TFTs being set corresponding to all sub pixels; a nth column of TFTs being arranged at positions where the nth column of sub pixels is close to the nth data line; a gate of TFT of the mth row, the nth column being electrically coupled to the mth scan line, and a drain being electrically coupled to the nth data line, and a source being electrically coupled to a sub pixel of the mth row, the nth column;

in the nth column of sub pixels, four sub pixels or two sub pixels, which are adjacent vertically in the upper and the lower being a pixel group, and the nth data line setting a signal period to define polarities of respective sub pixels in the pixel group to make polarity inversion occur at a edge of the two adjacent pixel groups in the upper and the lower, and polarities of two adjacent columns of sub pixels are opposite to achieve display effect similar to a dot inversion;

wherein in the nth column of sub pixels, the four sub pixels, which are adjacent vertically in the upper and the lower being a pixel group; in the two adjacent pixel groups in the upper and the lower, in the signal period corresponded with the pixel group in the upper, the nth data line collectively defines the four sub pixels in the pixel group to have a positive polarity or a negative polarity; in the signal period corresponded with the pixel group in the lower, the nth data line collectively defines the four sub pixels in the pixel group to have a negative polarity or a positive polarity so that the polarities of the two adjacent pixel groups in the upper and the lower are opposite;

wherein the TFT is a tri-gate TFT.

The benefits of the present invention are: the pixel driving structure and the liquid crystal display panel provided by the present invention arrange the nth column of TFTs at positions where the nth column of sub pixels is close to the nth data line; in the nth column of sub pixels, four sub pixels or two sub pixels, which are adjacent vertically in the upper and the lower are set to be a pixel group, and the nth data line sets a signal period to define polarities of respective sub pixels in the pixel group to make polarity inversion occur at a edge of the two adjacent pixel groups in the upper and the lower, and polarities of two adjacent columns of sub pixels are opposite to achieve display effect similar to a dot inversion. Accordingly, the pixel aperture regions can be neatly aligned to eliminate the display defects, such as the bright and dark lines and the irregular spots to prevent the color washout, to reduce the power consumption and to promote the display quality.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
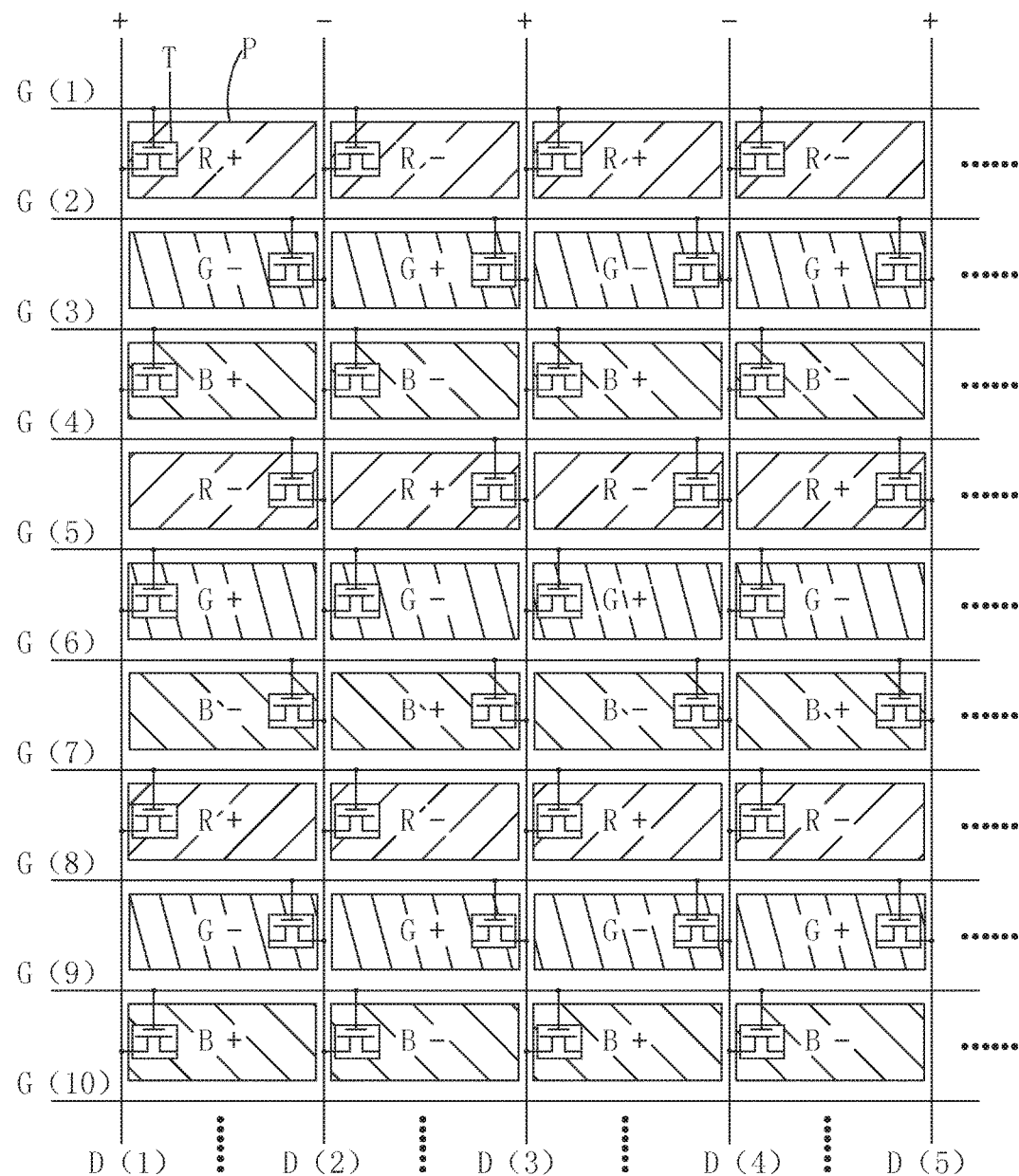
FIG. 1 is a diagram of a traditional pixel driving structure with a column inversion mode.
Figure 2:
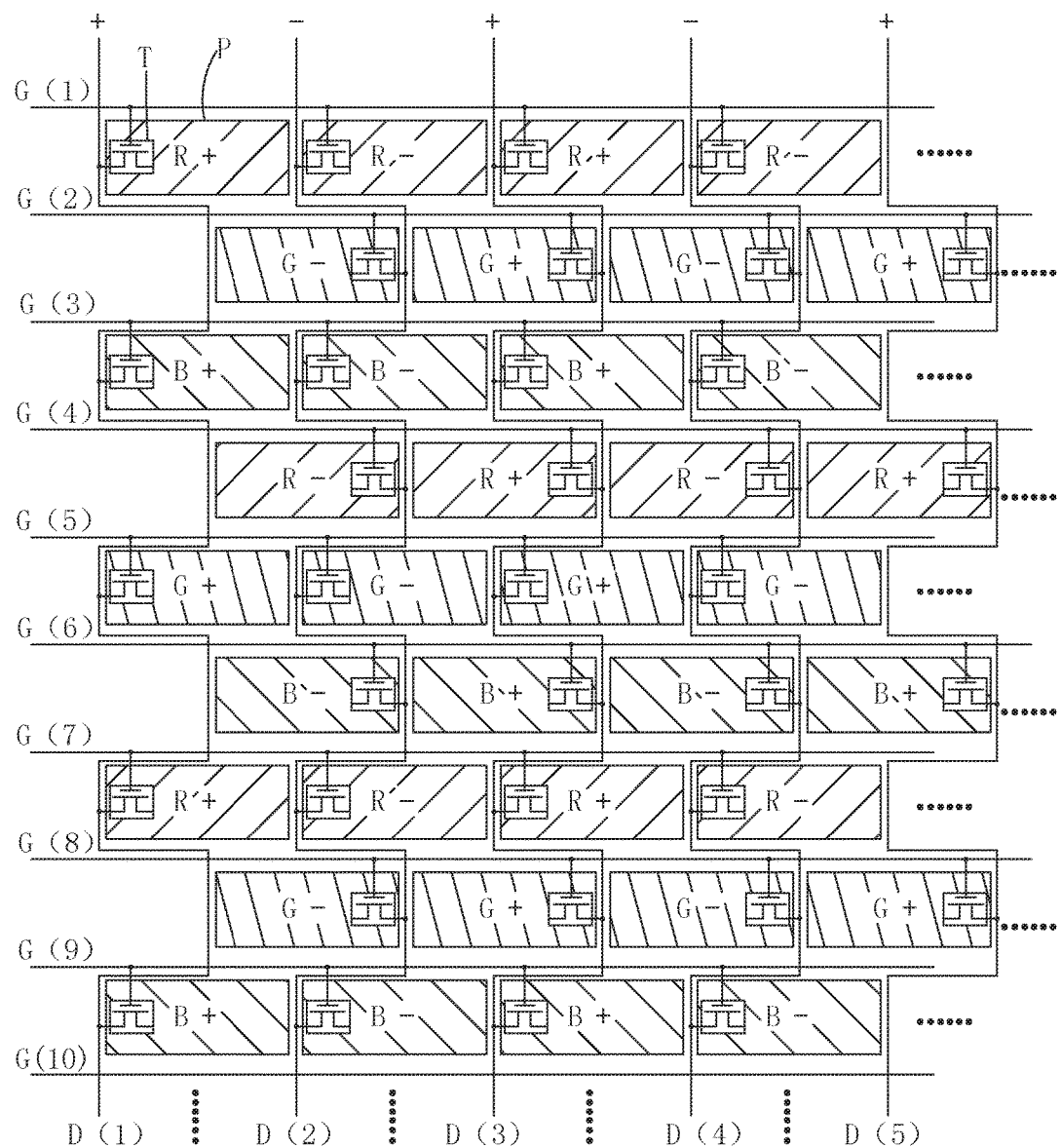
FIG. 2 is a diagram of a commonly used pixel driving structure with a column inversion mode.
Figure 3:
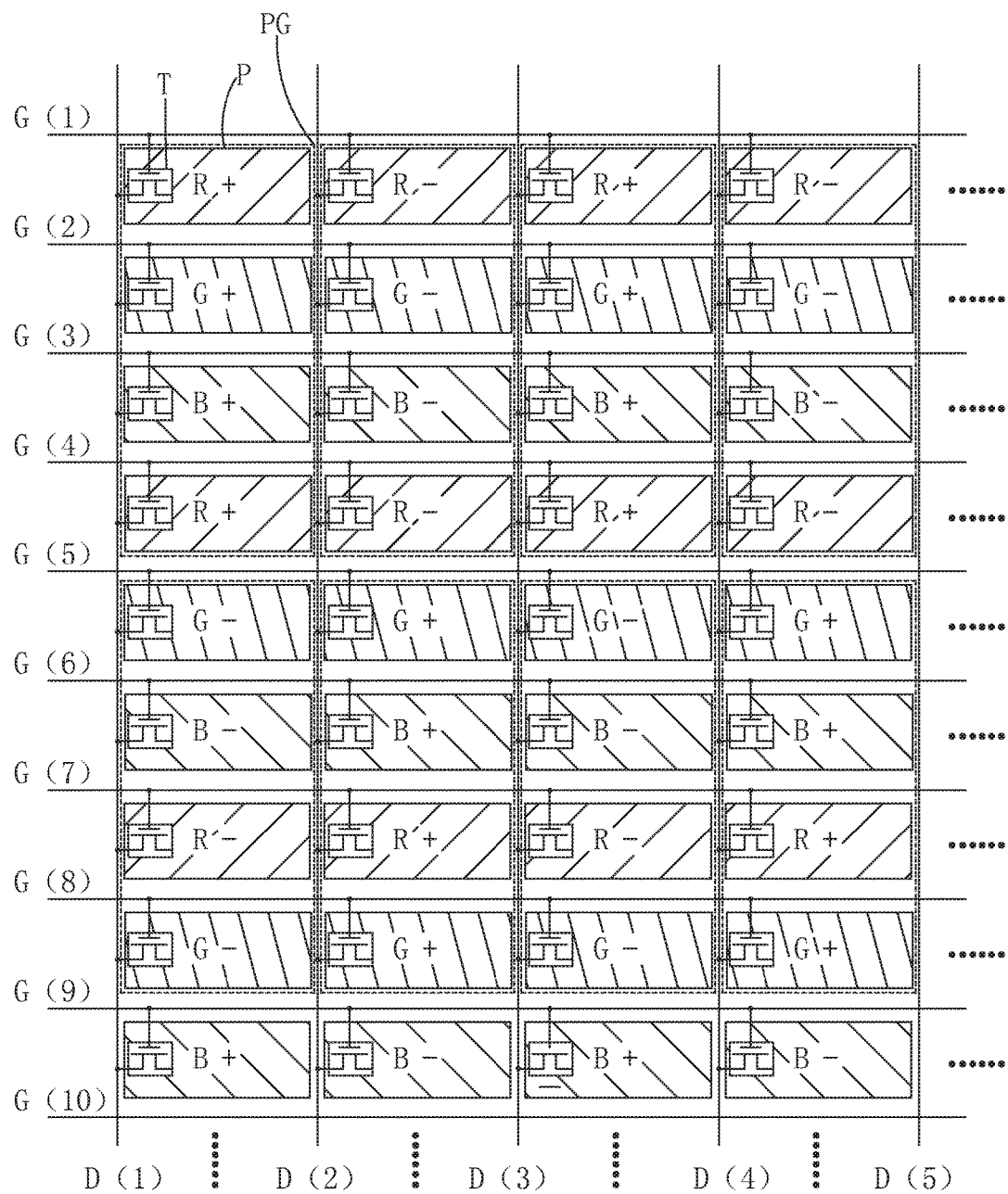
FIG. 3 is a diagram of the first embodiment according to the pixel driving structure of the present invention.

The present invention first provides a pixel driving structure. FIG. 3 shows the first embodiment according to the pixel driving structure of the present invention, comprising:

a plurality of sub pixels P arranged in array, and each column of sub pixels P being sequentially and repeatedly aligned in an order of a red sub pixel R, a green sub pixel G and a blue sub pixel B;

scan lines extending horizontally and corresponding to all rows of sub pixels P; m being set to be a positive integer, and a mth scan line G(m) being correspondingly set above a mth row of sub pixels P, and for instance, the first scan line G(1) being correspondingly set above the first row of sub pixels P, and the second scan line G(2) being correspondingly set above the second row of sub pixels P, and so on;

data lines extending vertically and corresponding to all columns of sub pixels P; n being set to be a positive integer, and a nth data line D(n) being correspondingly set at left of a nth column of sub pixels P, and for instance, the first data line D(1) being correspondingly set at left of the first column of sub pixels P, and the second data line D(2) being correspondingly set at left of the second column of sub pixels P, and so on;

and TFTs T being set corresponding to all sub pixels P; a nth column of TFTs T being arranged at positions where the nth column of sub pixels P is close to the nth data line D(n), and for instance, the first column of TFTs T being arranged at positions where the first column of sub pixels P is close to the first data line D(1), and the second column of TFTs T being arranged at positions where the second column of sub pixels P is close to the first data line D(2), and so on; a gate of TFT T of the mth row, the nth column being electrically coupled to the mth scan line G(m), and a drain being electrically coupled to the nth data line D(n), and a source being electrically coupled to a sub pixel P of the mth row, the nth column, and for instance, a gate of TFT T of the first row, the first column being electrically coupled to the first scan line G(1), and a drain being electrically coupled to the first data line D(1), and a source being electrically coupled to a sub pixel P of the first row, the first column; a gate of TFT T of the first row, the second column being electrically coupled to the first scan line G(1), and a drain being electrically coupled to the second data line D(2), and a source being electrically coupled to a sub pixel P of the first row, the second column; a gate of TFT T of the second row, the first column being electrically coupled to the second scan line G(2), and a drain being electrically coupled to the first data line D(1), and a source being electrically coupled to a sub pixel P of the second row, the first column, and so on;

in the nth column of sub pixels P, four sub pixels P, which are adjacent vertically in the upper and the lower being a pixel group PG, and for instance, in the first column of sub pixels P, four sub pixels P of the first row to the fourth row, which are adjacent vertically in the upper and the lower being a pixel group PG, and four sub pixels P of the fifth row to the eighth row, which are adjacent vertically in the upper and the lower being a pixel group PG, and so on; similarly in the second column of sub pixels P, four sub pixels P of the first row to the fourth row, which are adjacent vertically in the upper and the lower being a pixel group PG, and four sub pixels P of the fifth row to the eighth row, which are adjacent vertically in the upper and the lower being a pixel group PG, and so on.

The nth data line D(n) setting a signal period to define polarities of respective sub pixels P in the pixel group PG to make polarity inversion occur at an edge of the two adjacent pixel groups PG in the upper and the lower. With combination of FIG. 4, in the first embodiment, and in the signal period corresponded with the pixel group PG in the upper, the nth data line D(n) collectively defines the four sub pixels P in the pixel group PG to have a positive polarity; in the signal period corresponded with the pixel group PG in the lower, the nth data line D(n) collectively defines the four sub pixels P in the pixel group PG to have a negative polarity so that the polarities of the two adjacent pixel groups PG in the upper and the lower are opposite; alternatively, in the signal period corresponded with the pixel group PG in the upper, the nth data line D(n) collectively defines the four sub pixels P in the pixel group PG to have a negative polarity; in the signal period corresponded with the pixel group PG in the lower, the nth data line D(n) collectively defines the four sub pixels P in the pixel group PG to have a positive polarity so that the polarities of the two adjacent pixel groups PG in the upper and the lower are opposite; and polarities of two adjacent columns of sub pixels P being opposite, and the pixel driving structure can achieve display effect similar to a dot inversion.

Figure 4:
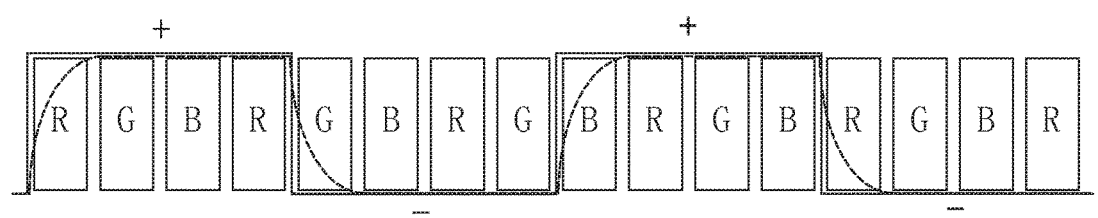
FIG. 4 is a diagram of an ideal waveform and an actual waveform in the data line of the first embodiment according to the pixel driving structure of the present invention.

FIG. 3 and FIG. 4 are illustrated, the first row to the fourth row of sub pixels P of the first column are collectively defined to have a positive polarity by the first data line D(1) in the corresponding signal period, and the fifth row to the eighth row of sub pixels P of the first column are collectively defined to have a negative polarity by the first data line D(1) in the corresponding signal period, and so on; the first row to the fourth row of sub pixels P of the second column are collectively defined to have a negative polarity by the second data line D(2) in the corresponding signal period, and the fifth row to the eighth row of sub pixels P of the second column are collectively defined to have a positive polarity by the second data line D(2) in the corresponding signal period, and so on to achieve display effect similar to a dot inversion.

Furthermore, the first data line D(1) and the first column of sub pixels P are illustrated, and the black thick full line in FIG. 4 is the ideal waveform of the first data line D(1), and the black thick dot line is the actual waveform of the first data line D(1). Because of the presence of signal delay, as the polarities of the sub pixels P are inverted, the signal requires a certain duration to change the positive polarity to the negative polarity or to change the negative polarity to the positive polarity to result in that the charging conditions of the sub pixels P at the polarity inversion position are worse. However, the polarity inversion of the sub pixels P in the first embodiment repeats to appear in the sequence of the red sub pixel R, the green sub pixel G, the blue sub pixel B, the red sub pixel R, the green sub pixel G, and the blue sub pixel B, and will not result in the poor charging rate of the sub pixels corresponded with some kind of color, and thus will not result in the white image color cast phenomenon due to that some certain color brightness is too low to possess the advantage of the dot inversion and the function of the color washout prevention.

The foregoing first embodiment does not only achieve display effect similar to a dot inversion and the color washout prevention but also eliminate the display defects, such as the bright and dark lines and the irregular spots because the nth column of TFTs T are arranged at positions where the nth column of sub pixels P is close to the nth data line D(n), and the respective TFTs T are aligned in column and the pixel aperture regions are neatly aligned; because the nth data line D(n) only needs to extend vertically, no wiring detouring is required and the overall length, the resistive loading, and the capacitive loading of the data line will not increase to reduce the power consumption; thus, the first embodiment can obviously promote the display quality.

Significantly, the TFT T is a tri-gate TFT (using a three-dimensional silicon fin to replace the planar gate on a conventional two-dimensional TFT), which can raise the TFT arrangement density to possess higher performance and efficiency.

Figure 5:
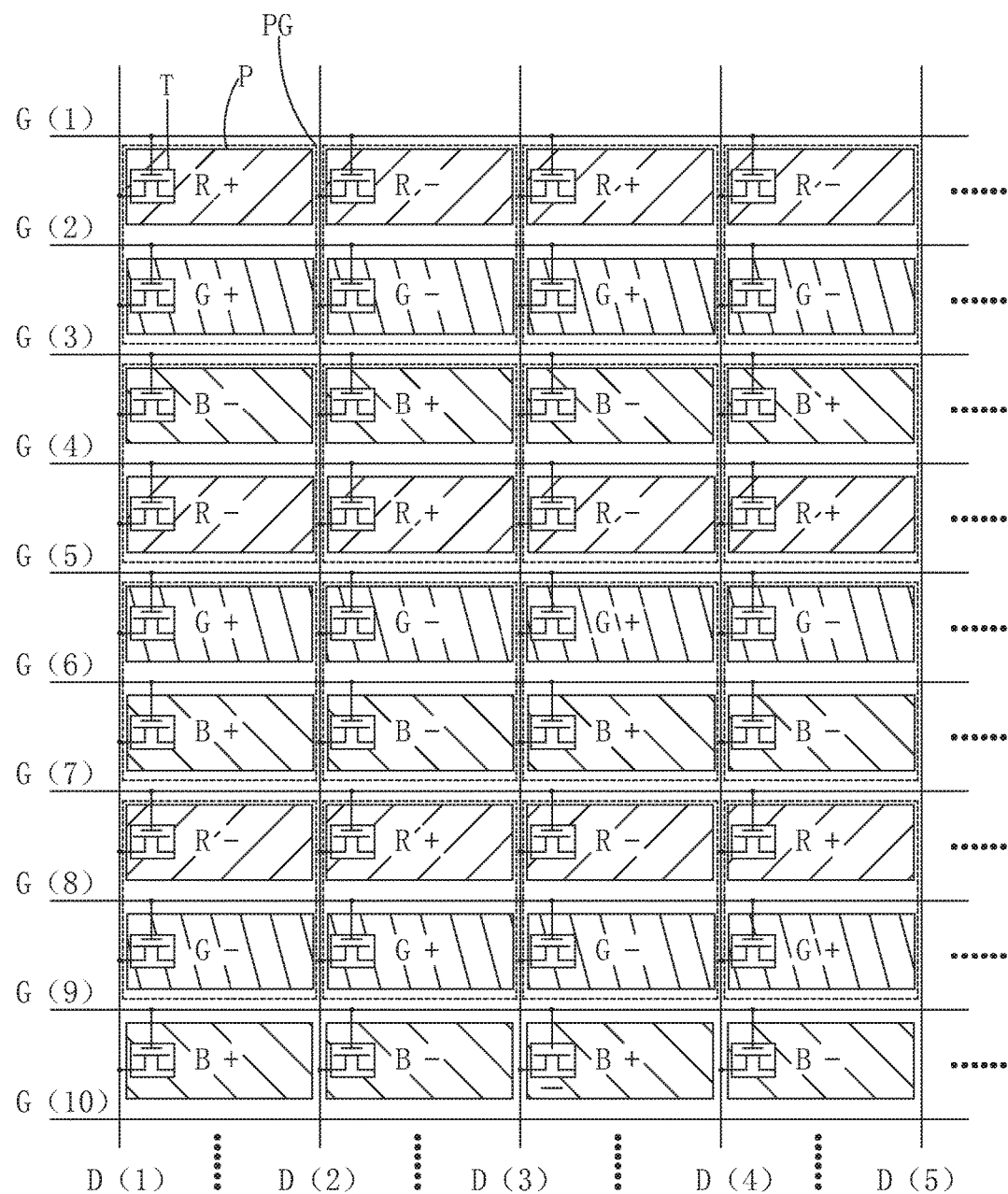
FIG. 5 is a diagram of the second embodiment according to the pixel driving structure of the present invention.

FIG. 5 shows the second embodiment according to the pixel driving structure of the present invention, and the difference of the second embodiment from the first embodiment is:

in the nth column of sub pixels, the two sub pixels, which are adjacent vertically in the upper and the lower being a pixel group; in the two adjacent pixel groups in the upper and the lower, in the signal period corresponded with the pixel group in the upper, the nth data line collectively defines the two sub pixels in the pixel group to have a positive polarity or a negative polarity; in the signal period corresponded with the pixel group in the lower, the nth data line collectively defines the two sub pixels in the pixel group to have a negative polarity or a positive polarity so that the polarities of the two adjacent pixel groups in the upper and the lower are opposite.

The nth data line D(n) setting a signal period to define polarities of respective sub pixels P in the pixel group PG to make polarity inversion occur at an edge of the two adjacent pixel groups PG in the upper and the lower. With combination of FIG. 6, in the second embodiment, in the signal period corresponded with the pixel group in the upper, the nth data line D(n) collectively defines the two sub pixels P in the pixel group PG to have a positive polarity; in the signal period corresponded with the pixel group PG in the lower, the nth data line D(n) collectively defines the two sub pixels P in the pixel group PG to have a negative polarity so that the polarities of the two adjacent pixel groups PG in the upper and the lower are opposite; alternatively, in the signal period corresponded with the pixel group in the upper, the nth data line D(n) collectively defines the two sub pixels P in the pixel group PG to have a negative polarity; in the signal period corresponded with the pixel group PG in the lower, the nth data line D(n) collectively defines the two sub pixels P in the pixel group PG to have a positive polarity so that the polarities of the two adjacent pixel groups PG in the upper and the lower are opposite; and polarities of two adjacent columns of sub pixels P being opposite, and the pixel driving structure can achieve display effect similar to a dot inversion.

Figure 6:
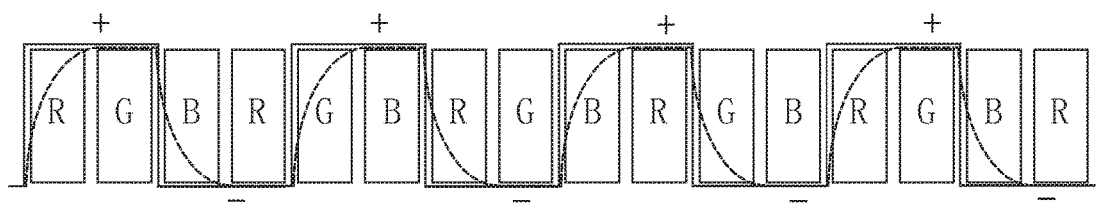
FIG. 6 is a diagram of an ideal waveform and an actual waveform in the data line of the second embodiment according to the pixel driving structure of the present invention.

FIG. 5 and FIG. 6 are illustrated, the first row to the second row of sub pixels P of the first column are collectively defined to have a positive polarity by the first data line D(1) in the corresponding signal period, and the third row to the fourth row of sub pixels P of the first column are collectively defined to have a negative polarity by the first data line D(1) in the corresponding signal period, and so on; the first row to the second row of sub pixels P of the second column are collectively defined to have a negative polarity by the second data line D(2) in the corresponding signal period, and the third row to the fourth row of sub pixels P of the second column are collectively defined to have a positive polarity by the second data line D(2) in the corresponding signal period, and so on to achieve display effect similar to a dot inversion.

Furthermore, the first data line D(1) and the first column of sub pixels P are illustrated, and the black thick full line in FIG. 6 is the ideal waveform of the first data line D(1), and the black thick dot line is the actual waveform of the first data line D(1). Because of the presence of signal delay, as the polarities of the sub pixels P are inverted, the signal requires a certain duration to change the positive polarity to the negative polarity or to change the negative polarity to the positive polarity to result in that the charging conditions of the sub pixels P at the polarity inversion position are worse. However, the polarity inversion of the sub pixels P in the first embodiment repeats to appear in the sequence of the red sub pixel R, the blue sub pixel B, the green sub pixel G, the red sub pixel R, the blue sub pixel B, and the green sub pixel G, and will not result in the poor charging rate of the sub pixels corresponded with some kind of color, and thus will not result in the white image color cast phenomenon due to that some certain color brightness is too low to possess the advantage of the dot inversion and the function of the color washout prevention.

The reset is the same as the first embodiment, and the repeated description is omitted here.

The foregoing second embodiment does not only achieve display effect similar to a dot inversion and the color washout prevention but also eliminate the display defects, such as the bright and dark lines and the irregular spots because the nth column of TFTs T are arranged at positions where the nth column of sub pixels P is close to the nth data line D(n), and the respective TFTs T are aligned in column and the pixel aperture regions are neatly aligned; because the nth data line D(n) only needs to extend vertically, no wiring detouring is required and the overall length, the resistive loading, and the capacitive loading of the data line will not increase to reduce the power consumption; thus, the second embodiment can obviously promote the display quality.

Figure 7:
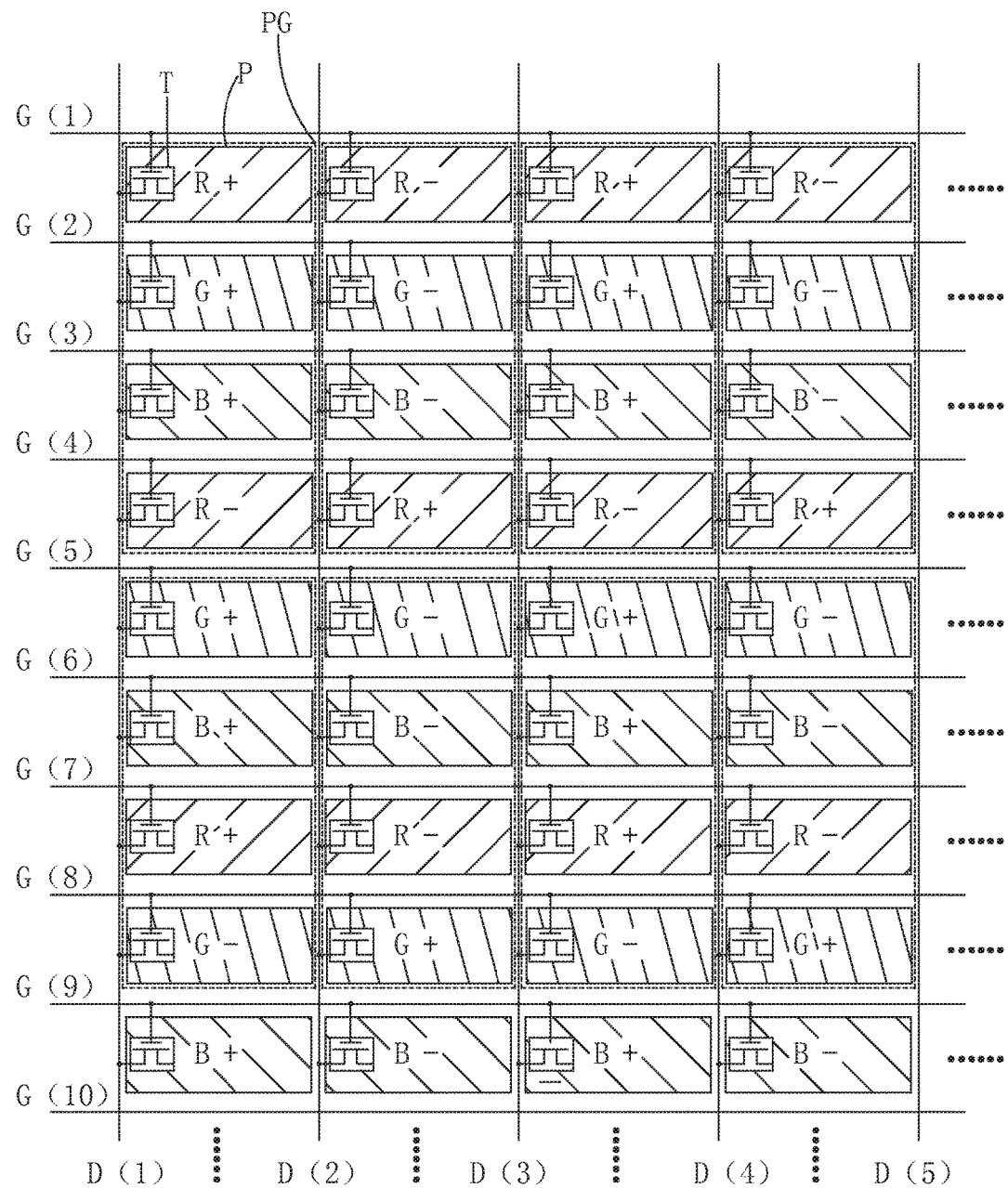
FIG. 7 is a diagram of the third embodiment according to the pixel driving structure of the present invention.

FIG. 7 shows the third embodiment according to the pixel driving structure of the present invention, and the difference of the third embodiment from the first embodiment is:

in the nth column of sub pixels P, four sub pixels P, which are adjacent vertically in the upper and the lower being a pixel group PG, and for instance, in the first column of sub pixels P, four sub pixels P of the first row to the fourth row, which are adjacent vertically in the upper and the lower being a pixel group PG, and four sub pixels P of the fifth row to the eighth row, which are adjacent vertically in the upper and the lower being a pixel group PG, and so on; similarly in the second column of sub pixels P, four sub pixels P of the first row to the fourth row, which are adjacent vertically in the upper and the lower being a pixel group PG, and four sub pixels P of the fifth row to the eighth row, which are adjacent vertically in the upper and the lower being a pixel group PG, and so on.

The nth data line D(n) setting a signal period to define polarities of respective sub pixels P in the pixel group PG to make polarity inversion occur at an edge of the two adjacent pixel groups PG in the upper and the lower. With combination of FIG. 8, in the third embodiment, in the signal period corresponded with the pixel group PG in the upper, the nth data line D(n) defines the first three sub pixels in the pixel group PG to have a positive polarity, and defines the last one sub pixel in the pixel group PG to have a negative polarity; in the signal period corresponded with the pixel group PG in the lower, the nth data line D(n) defines the first three sub pixels in the pixel group PG to have a negative polarity, and defines the last one sub pixel in the pixel group PG to have a positive polarity; alternatively, in the signal period corresponded with the pixel group PG in the upper, the nth data line D(n) defines the first three sub pixels in the pixel group PG to have a negative polarity, and defines the last one sub pixel in the pixel group PG to have a positive polarity; in the signal period corresponded with the pixel group PG in the lower, the nth data line D(n) defines the first three sub pixels in the pixel group PG to have a positive polarity, and defines the last one sub pixel in the pixel group PG to have a negative polarity; and polarities of two adjacent columns of sub pixels P are opposite, and the pixel driving structure can achieve display effect similar to a dot inversion.

Figure 8:
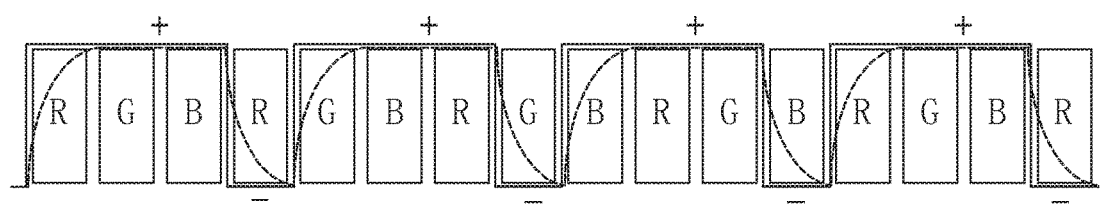
FIG. 8 is a diagram of an ideal waveform and an actual waveform in the data line of the third embodiment according to the pixel driving structure of the present invention.

FIG. 7 and FIG. 8 are illustrated, the first row to the third row of sub pixels P of the first column are collectively defined to have a positive polarity by the first data line D(1) in the corresponding signal period, and the fourth row of sub pixels P of the first column are collectively defined to have a negative polarity by the first data line D(1) in the corresponding signal period, and the fifth row to the seventh row of sub pixels P of the first column are collectively defined to have a negative polarity by the first data line D(1) in the corresponding signal period, and the eighth row of sub pixels P of the first column are collectively defined to have a negative polarity by the first data line D(1) in the corresponding signal period, and so on; the first row to the third row of sub pixels P of the second column are collectively defined to have a negative polarity by the second data line D(2) in the corresponding signal period, and the fourth row of sub pixels P of the second column are collectively defined to have a positive polarity by the second data line D(2) in the corresponding signal period, and the fifth row to the seventh row of sub pixels P of the second column are collectively defined to have a negative polarity by the second data line D(2) in the corresponding signal period, and the eighth row of sub pixels P of the second column are collectively defined to have a positive polarity by the second data line D(2) in the corresponding signal period, and so on to achieve display effect similar to a dot inversion.

Furthermore, the first data line D(1) and the first column of sub pixels P are illustrated, and the black thick full line in FIG. 8 is the ideal waveform of the first data line D(1), and the black thick dot line is the actual waveform of the first data line D(1). Because of the presence of signal delay, as the polarities of the sub pixels P are inverted, the signal requires a certain duration to change the positive polarity to the negative polarity or to change the negative polarity to the positive polarity to result in that the charging conditions of the sub pixels P at the polarity inversion position are worse. However, the polarity inversion of the sub pixels P in the first embodiment repeats to appear in the sequence of the red sub pixel R, the red sub pixel R, the green sub pixel G, the green sub pixel G, the blue sub pixel B, and the blue sub pixel B, and will not result in the poor charging rate of the sub pixels corresponded with some kind of color, and thus will not result in the white image color cast phenomenon due to that some certain color brightness is too low to possess the advantage of the dot inversion and the function of the color washout prevention.

The foregoing third embodiment does not only achieve display effect similar to a dot inversion and the color washout prevention but also eliminate the display defects, such as the bright and dark lines and the irregular spots because the nth column of TFTs T are arranged at positions where the nth column of sub pixels P is close to the nth data line D(n), and the respective TFTs T are aligned in column and the pixel aperture regions are neatly aligned; because the nth data line D(n) only needs to extend vertically, no wiring detouring is required and the overall length, the resistive loading, and the capacitive loading of the data line will not increase to reduce the power consumption; thus, the third embodiment can obviously promote the display quality.

The reset is the same as the first embodiment, and the repeated description is omitted here.

On the basis of the same inventive idea, the present invention further provides a liquid crystal display panel, comprising the aforesaid pixel driving structure. Accordingly, the pixel aperture regions are neatly aligned, and no display defects, such as the bright and dark lines and the irregular spots exist to possess the color washout prevention ability, the lower power consumption and the better display quality. No repeated description of the pixel driving structure is omitted here.

In conclusion, the pixel driving structure and the liquid crystal display panel of the present invention arrange the nth column of TFTs at positions where the nth column of sub pixels is close to the nth data line; in the nth column of sub pixels, four sub pixels or two sub pixels, which are adjacent vertically in the upper and the lower are set to be a pixel group, and the nth data line sets a signal period to define polarities of respective sub pixels in the pixel group to make polarity inversion occur at a edge of the two adjacent pixel groups in the upper and the lower, and polarities of two adjacent columns of sub pixels are opposite to achieve display effect similar to a dot inversion. Accordingly, the pixel aperture regions can be neatly aligned to eliminate the display defects, such as the bright and dark lines and the irregular spots to prevent the color washout, to reduce the power consumption and to promote the display quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A pixel driving structure, comprising:
    a plurality of sub pixels arranged in array, and each column of sub pixels being sequentially and repeatedly aligned in an order of a red sub pixel, a green sub pixel and a blue sub pixel;
    scan lines extending horizontally and corresponding to all rows of sub pixels; in being set to be a positive integer, and a mth scan line being correspondingly set above a mth row of sub pixels;
    data lines extending vertically and corresponding to all columns of sub pixels; n being set to be a positive integer, and a nth data line being correspondingly set at left of a nth column of sub pixels;
    and TFTs being set corresponding to all sub pixels; a nth column of TFTs being arranged at positions where the nth column of sub pixels is close to the nth data line; a gate of TFT of the mth row, the nth column being electrically coupled to the mth scan line, and a drain being electrically coupled to the nth data line, and a source being electrically coupled to a sub pixel of the mth row, the nth column;
    in the nth column of sub pixels, four sub pixels, which are adjacent vertically in the upper and the lower being a pixel group, and the nth data line setting a signal period to define polarities of respective sub pixels in the pixel group to make polarity inversion occur at a edge of the two adjacent pixel groups in the upper and the lower, and polarities of two adjacent columns of sub pixels being opposite to achieve display effect similar to a dot inversion,
    wherein in the nth column of sub pixels, the four sub pixels, which are adjacent vertically in the upper and the lower being a pixel group; in the two adjacent pixel groups in the upper and the lower, in the signal period corresponded with the pixel group in the upper, the nth data line defines the first three sub pixels in the pixel group to have a positive polarity or a negative polarity, and defines the last one sub pixel in the pixel group to have an opposite polarity of the polarity of the first three sub pixels; in the signal period corresponded with the pixel group in the lower, the nth data line defines the first three sub pixels in the pixel group to have a negative polarity or a positive polarity, and defines the last one sub pixel in the pixel group to have an opposite polarity of the polarity of the first three sub pixels to prevent poor charging rate of a sub pixel of one certain color in the red sub pixel, the green sub pixel and the blue sub pixel due to that one certain color brightness is too low.

2. The pixel driving structure according to claim 1, wherein the TFT is a tri-gate TFT.

3. A liquid crystal display panel, comprising a pixel driving structure, and the pixel driving structure comprising:
    a plurality of sub pixels arranged in array, and each column of sub pixels being sequentially and repeatedly aligned in an order of a red sub pixel, a green sub pixel and a blue sub pixel;
    scan lines extending horizontally and corresponding to all rows of sub pixels; in being set to be a positive integer, and a mth scan line being correspondingly set above a mth row of sub pixels;
    data lines extending vertically and corresponding to all columns of sub pixels; n being set to be a positive integer, and a nth data line being correspondingly set at left of a nth column of sub pixels;
    and TFTs being set corresponding to all sub pixels; a nth column of TFTs being arranged at positions where the nth column of sub pixels is close to the nth data line; a gate of TFT of the mth row, the nth column being electrically coupled to the mth scan line, and a drain being electrically coupled to the nth data line, and a source being electrically coupled to a sub pixel of the mth row, the nth column;
    in the nth column of sub pixels, four sub pixels, which are adjacent vertically in the upper and the lower being a pixel group, and the nth data line setting a signal period to define polarities of respective sub pixels in the pixel group to make polarity inversion occur at a edge of the two adjacent pixel groups in the upper and the lower, and polarities of two adjacent columns of sub pixels being opposite to achieve display effect similar to a dot inversion,
    wherein in the nth column of sub pixels, the four sub pixels, which are adjacent vertically in the upper and the lower being a pixel group; in the two adjacent pixel groups in the upper and the lower, in the signal period corresponded with the pixel group in the upper, the nth data line defines the first three sub pixels in the pixel group to have a positive polarity or a negative polarity, and defines the last one sub pixel in the pixel group to have an opposite polarity of the polarity of the first three sub pixels; in the signal period corresponded with the pixel group in the lower, the nth data line defines the first three sub pixels in the pixel group to have a negative polarity or a positive polarity, and defines the last one sub pixel in the pixel group to have an opposite polarity of the polarity of the first three sub pixels to prevent poor charging rate of a sub pixel of one certain color in the red sub pixel, the green sub pixel and the blue sub pixel due to that one certain color brightness is too low.

4. The liquid crystal display panel according to claim 3, wherein the TFT is a tri-gate TFT.

5. A pixel driving structure, comprising:
a plurality of sub pixels arranged in array, and each column of sub pixels being sequentially and repeatedly aligned in an order of a red sub pixel, a green sub pixel and a blue sub pixel;
scan lines extending horizontally and corresponding to all rows of sub pixels; in being set to be a positive integer, and a mth scan line being correspondingly set above a mth row of sub pixels;
data lines extending vertically and corresponding to all columns of sub pixels; n being set to be a positive integer, and a nth data line being correspondingly set at left of a nth column of sub pixels;
and TFTs being set corresponding to all sub pixels; a nth column of TFTs being arranged at positions where the nth column of sub pixels is close to the nth data line; a gate of TFT of the mth row, the nth column being electrically coupled to the mth scan line, and a drain being electrically coupled to the nth data line, and a source being electrically coupled to a sub pixel of the mth row, the nth column;
in the nth column of sub pixels, four sub pixels, which are adjacent vertically in the upper and the lower being a pixel group, and the nth data line setting a signal period to define polarities of respective sub pixels in the pixel group to make polarity inversion occur at a edge of the two adjacent pixel groups in the upper and the lower, and polarities of two adjacent columns of sub pixels are opposite to achieve display effect similar to a dot inversion;
wherein in the nth column of sub pixels, the four sub pixels, which are adjacent vertically in the upper and the lower being a pixel group; in the two adjacent pixel groups in the upper and the lower, in the signal period corresponded with the pixel group in the upper, the nth data line defines the first three sub pixels in the pixel group to have a positive polarity or a negative polarity, and defines the last one sub pixel in the pixel group to have an opposite polarity of the polarity of the first three sub pixels; in the signal period corresponded with the pixel group in the lower, the nth data line defines the first three sub pixels in the pixel group to have a negative polarity or a positive polarity, and defines the last one sub pixel in the pixel group to have an opposite polarity of the polarity of the first three sub pixels to prevent poor charging rate of a sub pixel of one certain color in the red sub pixel, the green sub pixel and the blue sub pixel due to that one certain color brightness is too low;
wherein the TFT is a tri-gate TFT.

* * * * *